United States Patent [19]

Hawrylo

[11] Patent Number: 4,547,230
[45] Date of Patent: Oct. 15, 1985

[54] LPE SEMICONDUCTOR MATERIAL TRANSFER METHOD

[75] Inventor: Frank Z. Hawrylo, Trenton, N.J.

[73] Assignee: The United States of America as represented by the Secretary of the Air Force, Washington, D.C.

[21] Appl. No.: 635,393

[22] Filed: Jul. 30, 1984

[51] Int. Cl.⁴ ............................... H01L 21/208
[52] U.S. Cl. .................... 148/171; 148/172; 156/624
[58] Field of Search ............... 148/171, 172; 156/624

[56] References Cited

U.S. PATENT DOCUMENTS

| | | | |
|---|---|---|---|
| 3,647,578 | 3/1972 | Barnett et al. | 148/171 |
| 3,690,965 | 9/1972 | Bergh et al. | 148/172 |
| 3,697,336 | 10/1972 | Lamorte | 148/171 |
| 3,753,801 | 8/1973 | Lockwood et al. | 148/171 |
| 4,123,302 | 10/1978 | Marinelli | 148/171 |
| 4,149,914 | 4/1979 | Weyrich et al. | 148/171 |
| 4,201,623 | 5/1980 | Sumner | 156/624 X |
| 4,218,269 | 8/1980 | van Oirschot et al. | 148/171 |
| 4,298,410 | 11/1981 | Nakajima et al. | 148/172 |
| 4,342,148 | 8/1982 | SpringThorpe et al. | 29/569 L |
| 4,373,989 | 2/1983 | Mattauch et al. | 156/635 |
| 4,386,975 | 6/1983 | Leibenzeder et al. | 148/171 |

*Primary Examiner*—George T. Ozaki
*Attorney, Agent, or Firm*—Donald J. Singer; Stanton E. Collier

[57] ABSTRACT

A method for liquid phase epitaxy maskless deposition of a III-V compound on a substrate in a pre-determined pattern includes the steps of contacting a growth wafer having a patterned mask thereon to a growth solution in equilibrium and then increasing the temperature of the growth solution and wafer thereby locally melting the exposed portions of the wafer surface and locally changing the equilibrium properties of the growth solution. The substrate upon which the material is to be deposited is then contacted with the growth solution and the temperature lowered. Because of the locally varying equilibrium conditions the constituents of the growth solution will be preferentially deposited on those portions of the substrate corresponding to the unmasked portions of the growth wafer.

4 Claims, 4 Drawing Figures

FIG. 1
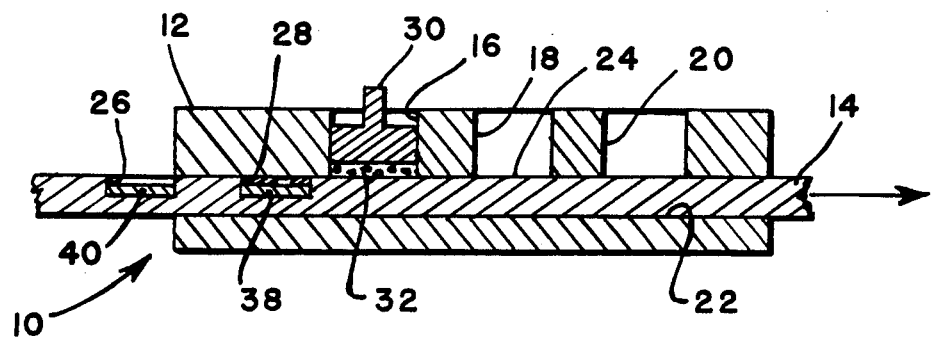
FIG. 2A
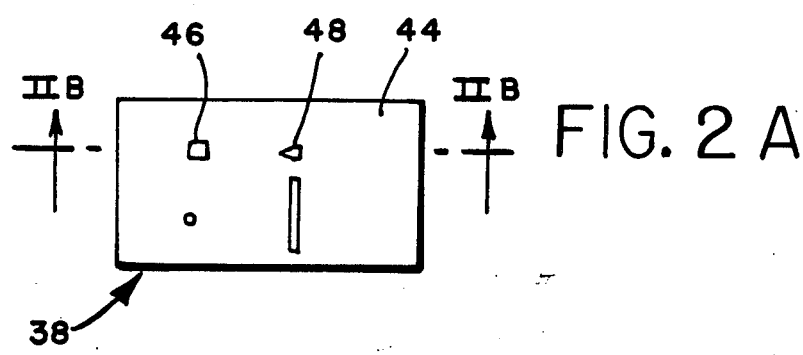
FIG. 2B
FIG. 3
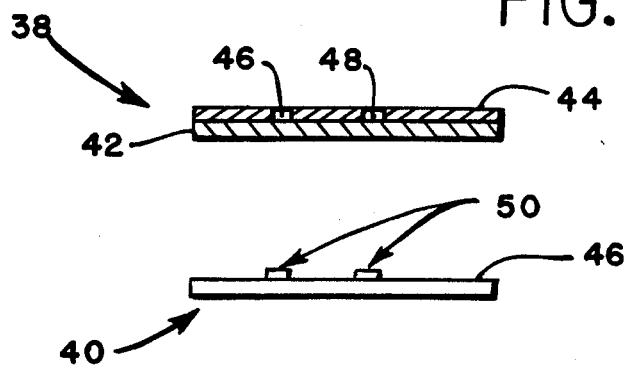

LPE SEMICONDUCTOR MATERIAL TRANSFER METHOD

STATEMENT OF GOVERNMENT INTEREST

The invention described herein may be manufactured and used by or for the Government for governmental purposes without the payment of any royalty thereon.

BACKGROUND OF THE INVENTION

This invention relates generally to liquid phase epitaxy (LPE), and, in particular, relates to a method of depositing on surfaces of semiconductors unique planar structures.

One previous method of forming unique shaped structures on a semiconductor planar surface involved first depositing a desired layer upon the surface using conventional LPE techniques. After this layer was formed, conventional photolithographic techniques are used to etch away undesired areas to form the desired shapes.

A masking layer such as silicon dioxide is deposited on the surface of the desired layer. The silicon dioxide layer can be deposited by conventional techniques of chemical vapor deposition, such as heating silane in an atmosphere containing oxygen at a temperature at which the silane decomposes to form silicon dioxide which then deposits on the desired layer. A photoresist layer is deposited on the masking layer and then developed to form desired shapes. Conventional photolithographic techniques are used to etch away the exposed portion of the masking layer to leave only the desired shape.

The above technique requires that the whole semiconductor surface be coated with a silicon dioxide masking layer or equivalent and the removal of that masking layer before the desired structures are formed.

This drawback has motivated a search for an alternative method applicable to LPE.

SUMMARY OF THE INVENTION

The instant invention sets forth a method of growing patterned shapes on an unmasked surface of a seed semiconductor wafer or other planar semiconductor surfaces.

A technique which has come into use for making certain types of semiconductor devices, particularly semiconductor devices made of group III-V semiconductor materials and their alloys, such as light emitting devices and transferred electron devices is known as "liquid phase epitaxy." Liquid phase epitaxy (LPE) is a method for depositing an epitaxial layer of a single crystalline semiconductor material on a substrate wherein a surface of the substrate is brought into contact with a solution of a semiconductive material so that a portion of the semiconductor material in the solution precipitates and deposits on the substrate as an epitaxial layer, and the remainder of the solution is removed from the substrate. The solution may also contain a conductivity modifier which deposits with the semiconductor material to provide an epitaxial layer of desired conductivity type. Two or more epitaxial layers can be deposited one on top of the other to form a semiconductor device of a desired construction including a semiconductor device having a PN junction between adjacent epitaxial layers of opposite conductivity type.

This method is carried out with a conventional furnace boat and slide. Into one bin of the boat is placed a liquid growth solution having elemental constituents the same as the first wafer in the slide. The percentage of each constituent is determined so that the liquid growth solution when placed in contact with the first wafer in the slide results in none of the wafer material being dissolved at a predetermined equilibrium temperature. The first wafer in the slide has a patterned surface protected by, for example, silicon dioxide with openings therein producing exposed areas. Conventional photolithographic techniques are used to mask and to create exposed areas on the surface of the first wafer. A second wafer being a seed wafer following the first wafer in the slide has a totally exposed surface onto which structures are to be grown.

The liquid growth solution with the preweighted constituents are initially heated to the equilibrium temperatures for a period of time. After which, preferably, the growth wafer being the first wafer is pulled under the growth solution and then the temperature is raised, or the temperature can be first raised prior to introduction of the growth wafer to the growth solution. Since the temperature is above the equilibrium temperature some of the semiconductor growth wafer is dissolved into the growth solution from the areas that are exposed. Before the growth solution achieves equilibrium at the higher temperature, the growth wafer is removed. As a result, the dissolved material will not have time to diffuse throughout the growth solution and remains basically in the areas closely resembling the exposed areas on the growth wafer. The temperature controller is reset for cooling down at a preselected rate. Next, the seed wafer is exposed to this growth solution at about the original equilibrium temperature thus resulting in the dissolved material being deposited on the seed wafer without the dissolution of the seed wafer under the non-patterned areas of the growth solution. This results in the seed wafer having the patterns resembling the exposed areas on the growth wafer. After this deposition, the seed wafer is removed.

Thus, an object of the present invention is a method of transferring semiconductor material from a growth wafer to a seed wafer to form predetermined shapes.

Another object of the present invention is a method of placing structures on a semiconductor wafer without the use of photolithographic techniques on that surface.

These and many other objects and advantages of the present invention will be readily apparent to one skilled in the pertinent art from the following detailed description of a preferred embodiment of the invention and the related drawings.

BRIEF DESCRIPTION OF THE DRAWINGS

FIG. 1 is a side view of the graphite furnace boat and slide used in the present invention.

FIG. 2A and 2B are views of a growth wafer having thereon patterned exposed areas; the growth wafer being placed in the first recess of the slide; and FIG. 3 is a view of a seed wafer having thereon the deposited structures transferred from a growth wafer of the present invention.

DETAILED DESCRIPTION OF THE PREFERRED EMBODIMENT

Referring to FIG. 1, an apparatus 10 can be used to perform the method of this invention. Other equipment required, but not shown, is conventional in the art of liquid phase epitaxy. Apparatus 10 has a furnace boat 12 and a slide 14, both made of refractory, inert material such as graphite.

Furnace boat 12 has typically several spaced wells 16, 18 and 20 but for the purpose of the present invention only well 16 is required. A passage 22 extends through boat 12 and into which slide 14 closely fits. A top surface 24 of slide 14 forms the bottoms of wells 16, 18 and 20. Slide 14 has a pair of spaced recesses 26 and 28 that are used to hold semiconductor wafers and are of a horizontal cross section comparable to that of wells 16, 18, and 20. A refractory inert weight 30 is closely inserted into well 16 so that a liquid growth solution 32, for example, is spread uniformly across the bottom of well 16. A growth wafer 38 is placed in recess 28 and a seed wafer 40 is placed in recess 26. FIGS. 2A and 2B illustrate a growth wafer 38 and FIG. 3 illustrates a seed wafer 40. The dimensions shown are only illustrative and are not intended to be realistic unless otherwise stated.

Referring to FIGS. 2A and 2B, growth wafer 38 is placed in recess 28 after selected areas are exposed by conventional photolithographic techniques.

Growth wafer 38 can have a substrate 42 of semiconductor material such as InP, GaAs, InGaAsP, AlGaAs, etc., and a silicon dioxide ($SiO_2$) mask 44. Mask 44 has selected areas removed to expose the surface of substrate 42 such as exposed areas 46 and 48. The shape of exposed area 46 may be of any desired useful form that would be placed on a planar semiconductor surface 46 of a seed substrate 48, shown in FIG. 3. The underlying semiconductor structures are not shown.

The desired $SiO_2$ mask 44 is placed on substrate 42 as follows: a layer of $SiO_2$ is deposited on substrate 42. A resist layer is deposited on the $SiO_2$ layer and the pattern of exposed areas is established in the resist. Selective areas of the resist are removed and then the $SiO_2$ layer exposed thereunder is removed by buffer HF. The resist is then removed leaving mask 44 on substrate 42 having exposed areas such as 46, 48, etc. After being properly prepared, growth wafer 38 is placed in recess 28 along with a seed substrate 48 being placed in recess 26.

To achieve the type of material transfer desired, growth solution 32 is prepared by weight of its elemental constituents to be in equilibrium with substrate 42 having the same elemental constituents at a given temperature. Liquid growth solution 32 containing semiconductor elements when in equilibrium at a predetermined growth temperature will not dissolve any portion or precipitate onto a semiconductor substrate comprised of the same elements.

Growth solution 32 for indium phosphide (InP) is about 5 grams of indium and about 0.04 grams of indium phosphide. The temperature at equilibrium is about 635° C.

The furnace, not shown, with apparatus 10 should be heated to equilibrium temperature, for example, of about 635° C. for InP for a period of about 2 hours. After this, the temperature is increased a predetermined amount, based upon the amount of meltback desired and material to be transferred, for a predetermined short period of time. At this point slide 14 is moved to bring growth wafer 38 under growth solution 32. The amount of material dissolved from the exposed areas is determined by the degrees increased in temperature above the equilibrium temperature and the length of time growth wafer 38 is held under growth solution 32.

What is critical is that the original liquid growth solution 32 preparations must be retained between the exposed areas. If growth wafer 38 is held too long under solution 32, solution 32 would achieve equilibrium at the raised temperature. This step is critical and depends on the rate of diffusion of phosphorus or other pertinent elements throughout growth solution 32 thus resulting in the loss of the patterns.

After a sufficient period of time when acceptable dissolution of growth wafer 38 has occurred, growth wafer 38 is then removed from growth solution 32; the temperature controls are reset to ramp down the temperature in a controlled manner and at about the equilibrium temperature, 635° C., seed wafer 40 is pulled under the growth solution 32. Continued cooling of the furnace results in structures 50 being epitaxially grown on surface 46 of seed wafer 40. The temperature increase from the equilibrium temperature determines the degrees of super-cooling resulting in a controlled thickness of the materials deposited.

As a result of the above method, semiconductor material is dissolved from the exposed areas in the $SiO_2$ mask, the shapes of these exposed areas are retained in growth solution 32, and are then epitaxially deposited on seed wafer 40 to very closely resemble the shapes of exposed areas 46, etc. After growth completion, seed wafer 40 is removed from well 26.

This method can be used, for example, to place patterned ohmic contacts on underlying PN junction structures, to establish contact pads for machine bonding, and to form isolated semiconductor device structures.

Clearly, many modifications and variations of the present invention are possible in light of the above teachings and it is therefore understood, that within the inventive scope of the inventive concept, the invention may be practiced otherwise than specifically claimed.

What is claimed is:

1. A method of transferring semiconductor material to form predetermined patterns by liquid phase epitaxy, said method comprising the steps of:
   (1) preparing a top surface of a growth wafer for photolithography;
   (2) placing a mask on said wafer, said mask having areas removed whereby said top surface of said growth wafer has selected exposed areas;
   (3) preparing a liquid growth solution in a well of furnace boat, said growth solution having elemental constituents the same as said growth wafer;
   (4) heating said growth solution for a period of time so that an equilibrium is established in said growth solution;
   (5) placing said growth wafer in contact with said growth solution;
   (6) raising the temperature of said growth solution a predetermined amount based upon the amount of semiconductor material to be transferred and the length of time exposed to said growth wafer at an elevated temperature;
   (7) removing said growth wafer from said growth solution;
   (8) lowering the temperature of said growth solution in a controlled manner;
   (9) selectively placing a seed wafer under said growth solution at about equilibrium;
   (10) lowering the temperature a predetermined amount so that non-equilibrium conditions cause epitaxial deposition of said material; and

(11) removing said seed wafer from said growth solution after epitaxial deposition of said patterns.

2. A method as defined in claim 1 wherein said growth wafer is composed of III-V elements.

3. A method as defined in claim 2 wherein said III-V elements are selected from the group consisting of InP, GaAs, InGaAsP and AlGaAs.

4. A method as defined in claim 1 wherein steps 5 and 6 are reversed whereby the temperature is raised after said growth wafer is placed in contact with said growth solution.

* * * * *